(12) United States Patent
Egner et al.

(10) Patent No.: US 6,701,408 B2
(45) Date of Patent: Mar. 2, 2004

(54) DATA PROCESSING DEVICE WITH A MEMORY LOCATION IN WHICH DATA IS STORED ACCORDING TO A WOM CODE

(75) Inventors: Sebastian Egner, Eindhoven (NL); Franciscus Petrus Widdershoven, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 92 days.

(21) Appl. No.: 10/014,226

(22) Filed: Dec. 11, 2001

(65) Prior Publication Data

US 2002/0087784 A1 Jul. 4, 2002

(30) Foreign Application Priority Data

Dec. 15, 2000 (EP) .............................................. 00204599

(51) Int. Cl.$^7$ ................................................ G06F 12/00
(52) U.S. Cl. ........................ 711/101; 711/154; 711/163
(58) Field of Search ................................ 711/111, 154, 711/101, 163

(56) References Cited

U.S. PATENT DOCUMENTS 4,691,299 A * 9/1987 Rivest et al. .......... 365/189.01

* cited by examiner

Primary Examiner—Reba I. Elmore
Assistant Examiner—Kathy Takeguchi
(74) Attorney, Agent, or Firm—Aaron Walker (57) ABSTRACT

A device contains a memory that stores a WOM codeword that encodes successive generations of data values. When the codeword must be updated to represent a new data value, the device determines which updates of the dataword can be realized by feasible single bit updates to the WOM codeword. If no feasible single bit update is possible, feasible two-bit updates are considered. Under control of the new data values a connection circuit routes feasibility signals for various updates, that signal the single-bit feasibility of the updates. Routing brings together pairs of feasibility signals for updates that together produce a WOM codeword that encodes the new data value. A pair is selected in which both feasibility signals indicate feasibility and the codeword is updated according to the updates involved in the pair. Preferably, the routing is realized with a connection circuit that comprises a number of layers of subcircuits, each routing the feasibility signals dependent on a respective bit of the new dataword. Also preferably, the WOM code is designed so that each of a number of updates to the data word can be realized by setting singles ones of a plurality of bits.

5 Claims, 6 Drawing Sheets

DATA PROCESSING DEVICE WITH A MEMORY LOCATION IN WHICH DATA IS STORED ACCORDING TO A WOM CODE

The field of the invention is a data processing device with a memory location in which data is stored according to a WOM (Write Once Memory) code.

WOM codes are known from U.S. Pat. No. 4,691,299. In a WOM code, a data word is encoded in a number of bits in a memory location. The code is designed so that each time the data word is changed, the new data word can be written by only setting bits in the memory location, without resetting any bits. This is especially useful for many types of memory in which setting and resetting are asymmetric operations, in the sense that resetting, if not impossible, requires much more overhead than setting.

A known type of WOM code is the so-called linear WOM code. In the known linear WOM code the memory location contains as many bits as there are possible values of the data, less one. That is, if the data contains k-bits (e.g. k=8) then the memory location contains n=(2k)−1 bits (e.g. n=255). Each bit in the memory location is associated with a different non-zero possible value of the data, also called the mask vector. When the data is decoded from the codeword stored in the memory location, one adds the mask vectors associated with those bits that have been set (the word "adding" here is used in a generalized sense: it can refer to addition modulo 2k, but it can also refer to bit-wise exclusive or of the bits of the mask vector as the same level of significance).

The content of the memory location starts with all zero bits. The first data value can be written simply by setting a single bit, whose mask vector equals the data value. In subsequent generations, it may be necessary to set more than one bit at a time, always so that the sum of the mask vectors of the bits that are set add up to a required change in the encoded data value. Unfortunately, the selection of the bits that have to be set is a complex problem if it is not possible to change the data by setting a single bit (when the bit whose mask equals the required change has already been set). Normally speaking therefore, encoding requires searching for an appropriate combination of bits. The time required to search increases as the number of bits in the location increases. The need to keep the time for this search within reasonable bounds has meant that the number of bits in the memory location has had to be kept small.

It is an object of the invention to increase the number of bits that can be used for storing WOM codewords in a data processing device, without an excessive increase in search time for encoding.

A data processing device according to the invention is described in claim 1. When the codeword must be updated to represent a new data value, the device determines which updates of the dataword can be realized by feasible single bit updates to the WOM codeword, this is signaled by feasibility signals. The feasibility signals for various updates are routed under control of the new data values to bring together pairs of feasibility signals for updates that together produce a WOM codeword that encodes the new data value. A pair is selected in which both feasibility signals indicate feasibility and the codeword is updated according to the updates involved in the pair. Thus, two-bit updates can be found with a search time that is hardly dependent on the number of bits in the codeword.

An embodiment of the device realizes routing with a connection circuit that comprises a number of layers of subcircuits, each routing the feasibility signals dependent on a respective bit of the change in encoded data necessitated by the new dataword. The search time corresponds to the delay through the layers, which is only logarithmically dependent on the number of bits in the codeword that encode different updates. The hardware scales little more than linearly with this number of bits. Preferably, two feasibility signals in a pair of such signals that is considered to detect to detect a feasible two-bit update are each routed through half the layers (plus or minus one) before detecting whether both indicate feasibility. Thus the delay is minimized before both signals have reached the coincidence detector.

In a further embodiment the memory location that stores the encoded dataword is reset if the new data value cannot be encoded by setting two or fewer bits. This reduces the search time by pruning the search. Of course such pruning entails a loss in the number of times data can be written. However, it has been found that, especially for larger codewords, this loss is quite small, even more so when each of a number of updates more can be realized by setting more than one bit in the initial code word before any data has been written.

Preferably, data is decoded from the WOM code by summing mask vectors associated with respective bits in a memory location. Also preferably a WOM code is used in which a number of mask vectors can be realized by setting single ones of a plurality of bits that correspond to a same mask vector. This increases the number of times that data can be written to the memory without any significant increase in the time needed to search for appropriate updates.

In an embodiment of the device, the feasibility signals are generated by detecting whether any of the bits that correspond to the same mask vector are not yet set. Preferably, the bits that correspond to the same mask vector are added first during decoding, followed by adding of the mask vectors for which the sum of the added bits is set. This reduces the hardware needed for encoding and decoding respectively.

In a further embodiment not all of the mask vectors are realized by the same number of bits in the memory location. Thus, the codeword can be easily adapted to the available memory for the codeword.

These and other advantageous aspects of the data processing device according to the invention will be described in more detail using the following figures.

Figure 1:
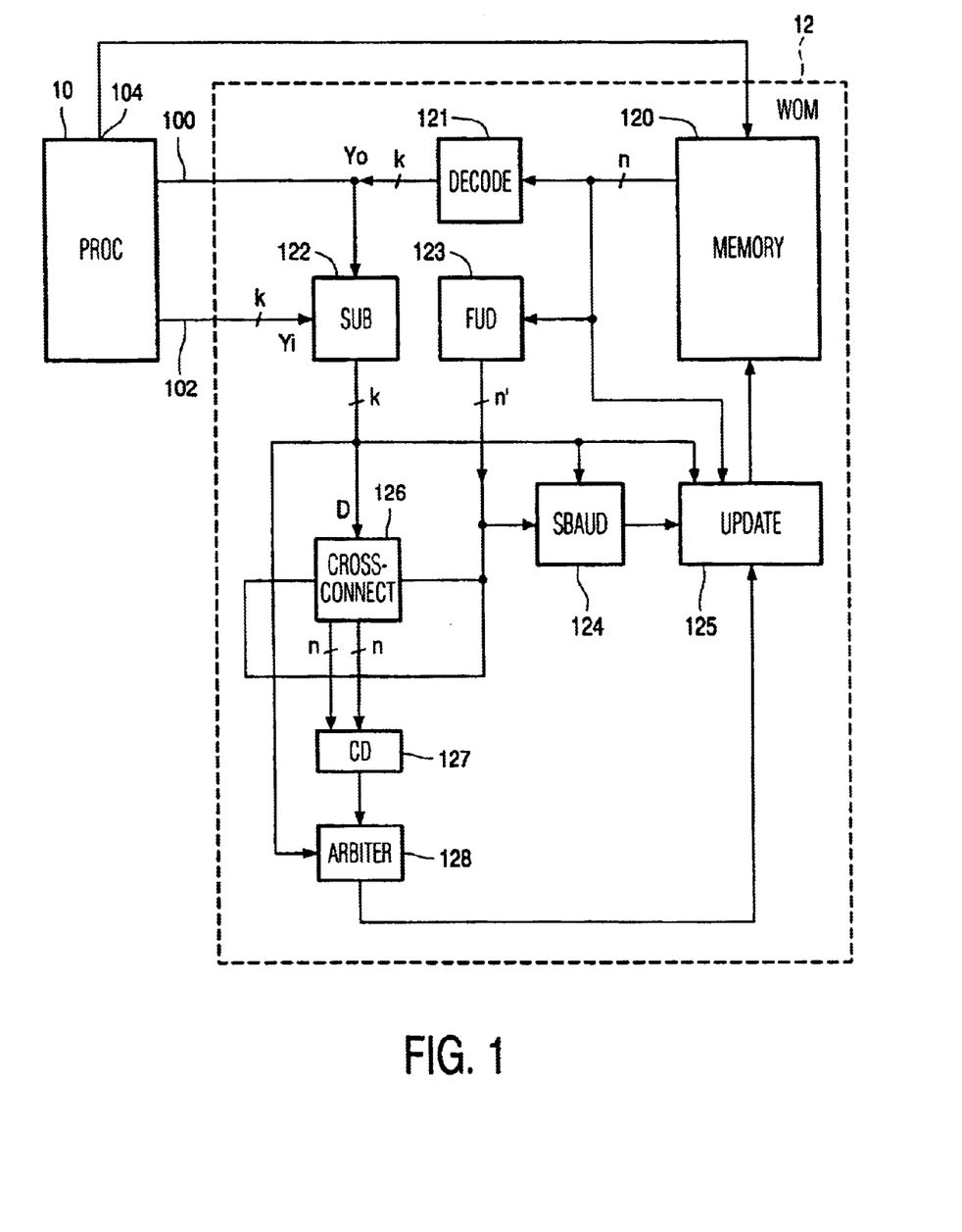
FIG. 1 shows a data processing circuit

FIG. 1 shows a data processing circuit. The circuit contains a processor 10, and a WOM memory unit 12. The processor 10 has a data input 100, a data output 102 and an address output 104. The WOM memory unit 12 contains a memory 120, a decoder 121, a subtractor 122, a feasible update detection circuit 123, a single bit adequate update detection circuit 124, an update circuit 125, a cross-connection circuit 126, a coincidence detector 127 and an arbiter 128.

The address output 104 of the processor 10 is connected to an address input of memory 120. Memory 120 has a data output coupled to decoder 121, feasible update detection circuit 123 and update circuit 125. Decoder 121 has a decode output coupled to the data input 100 of processor 10. The decode output of the decoder 121 and data output 102 of processor 10 are coupled to subtractor 122. An output of the subtractor 122 and the feasible update detection circuit 123 are coupled to single bit adequate update detection circuit 124, which in turn has an output coupled to update circuit 125. Update circuit 125 has a write output coupled to memory 120.

The output of feasible update detection circuit 123 is coupled to two inputs of cross-connection circuit 126. The outputs of cross-connection circuit 126 are coupled to a second input of coincidence detector 127. The output of the subtractor 122 is coupled to a control input of cross-connection circuit 126. The output of coincidence detector 127 is coupled to arbiter 128. Arbiter 128 has a control input coupled to the output of subtractor 122 and outputs coupled to update circuit 125.

In operation processor 10 reads data from and/or writes data to WOM memory unit 12. During reading processor 10 supplies an address to memory 120, which in turn retrieves a WOM code word from an addressed location and outputs the WOM code word to decoder 121. The WOM code word is n bits wide. In response to the code word decoder 121 decodes a data word from the WOM code word and supplies the decoded data word to the data input 100 of the processor 10. The data word is k bits wide (k<n).

WOM codes are codes that are designed for memories in which it is much more difficult (if at all possible) to reset bits than to set bits. Examples of such memories are PROM memory or a flash EEPROM memory. The WOM code defines a relation between the code word X in memory 12 and the data word Y obtained by decoding this codeword X. This relation is designed so that if a codeword X0 encoding a first data word value Y0 is stored in the memory, the codeword X0 can be updated by setting bits so that the updated codeword encodes a second data word value Y1, without resetting any bits in the codeword X0. Such updates that can be realized by setting bits, without resetting any bits, are called feasible.

The quality of a WOM code can be measured from the number T of successive generations of data values that can be encoded in the code word by setting bits without any resetting. A measure of quality, called the rate R of the WOM code is the ratio between the number of bits k*T in the generations divided by the number of bits n used to store these k*T bits:

$$R=kT/n$$

It has been found that rate R values substantially in excess of 1 are possible, increasingly so if k and n made larger.

A rate Rmin can be determined for worst case situations, taking the T value that occurs under the most unfavorable series of data values. This is a relevant parameter for write once memories, in which a memory location once it is impossible to update the encoded data by setting bits in memory without setting any bits.

In case the memory can be reset, be it at the expense of a considerable delay, such as in the case of an EEPROM or a flash memory, it is more relevant to determine the average rate Rav. Rav is defined by taking median of the T values of all possible series of data values. Rav is indicative of the frequency F, with which the memory needs to be reset (F=1/T), and thus of the delay incurred due to resetting and wear of the memory (for memories that a capable of a limited number of reset cycles before becoming unreliable due to wear).

One example of a WOM code is a so-called linear WOM code, in which the decoded data word is determined from $$Y=SUMiXi*Wi$$

which is the sum over i of products Xi*Wi, where i indexes n bit positions in the code word, Xi is the content of the code word at bit position i and Wi is a k-bit mask vector assigned to bit position i. Preferably all possible k-bit non-zero bit vectors are available as mask vectors for different bit positions i. It should be noted that the addition used in this sum may be arithmetic addition modulo 2 to the power k, or bit-wise addition (taking the bitwise exclusive or of the mask vectors Wi for which Xi is not zero) or any other type of operation that satisfies the basic axioms of addition.

In the prior art n=(2k)−1 (2k demotes taking the kth power of 2), that is, n is so large that all possible non-zero values of Wi occur exactly once. For this value of n the prior art has been able to prove various results about Rmin, the worst case rate.

Figure 2:
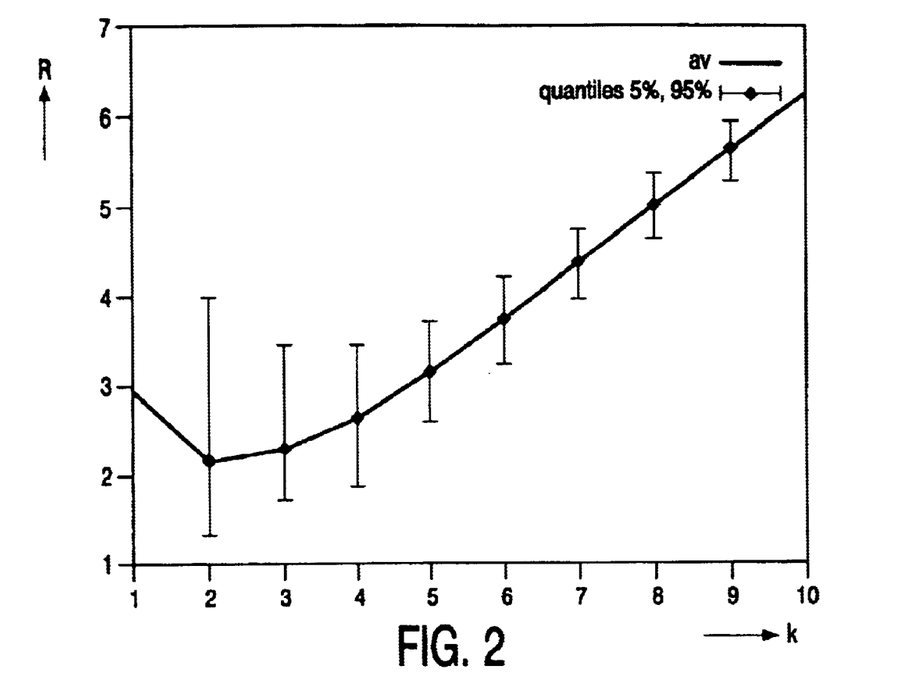
FIG. 2 shows a graph of WOM storage rate versus dataword size

FIG. 2 shows a graph of the average rate Rav of such a WOM code as a function of the data word size k, obtained by averaging the number of generations used to encode a number of randomly selected series of data values. The balls indicate the average. The vertical bars (so-called quantiles) indicate the range of rate values R that occur for different ones of the randomly selected sequences. This range excludes the rate values R that occur for the 5% series with the lowest rates and the 5% sequences with the highest rates. As can be seen, the WOM code becomes more efficient as the data word size k (and with it the code word size n=2k−1) increases. There is an increase with an approximately linear factor of k over and above the normal increase of ((2k)−1)/k in the number of times data words can be written.

In an embodiment of the invention a larger value of n is used: n>(2**k)−1. In this embodiment, at least one, but preferably two or more mask vector Wi is associated with more than one of the bits in the code word. The decoded data word is the sum (in the generalized sense mentioned above) of the mask vectors associated with the bits in the codeword that have been set. Effectively, this makes it possible for example to perform an update to the data word and subsequently to undo that update. The update is realized by setting a bit "i" in the codeword that corresponds with a mask vector Wi equal to the required update. The update is undone by setting another bit "j" that corresponds to a mask vector Wj equal to the mask vector Wi of bit i.

The use of a larger code word size n increases the efficiency of the WOM code.

Figure 3:
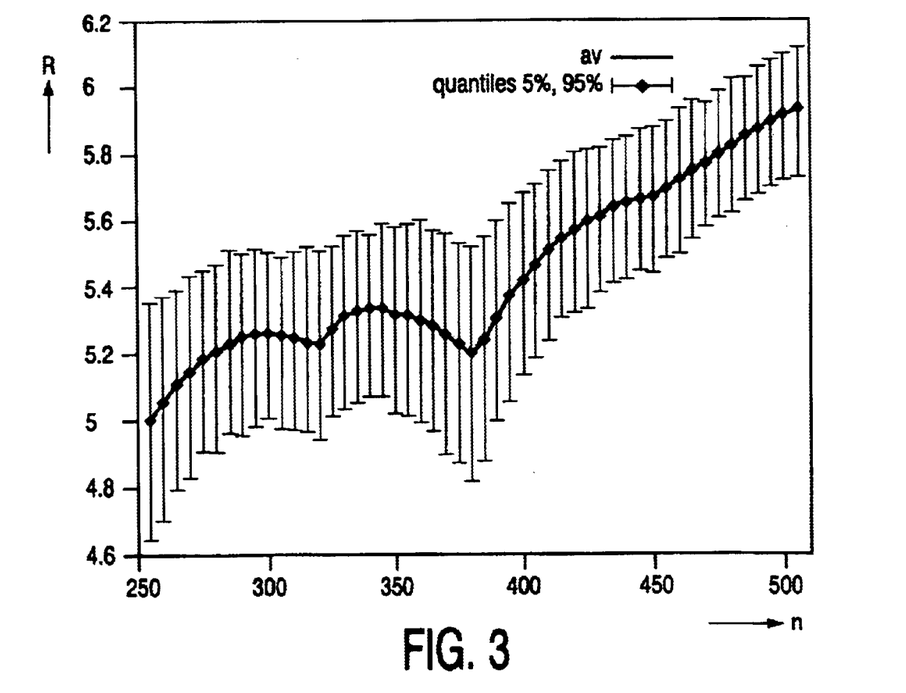
FIG. 3 shows a graph of WOM storage rate versus codeword size

FIG. 3 shows the average rate Rav as a function of the codeword size n for fixed data word size k=8 (the dots and quantiles have the same meaning as in FIG. 2). FIG. 3 shows that increasing n increases the number of times data words can be written over and above the "normal" increase with n/k. The prior art value of n=(2k)−1 (=255 in the example of FIG. 3) is in no sense an optimum value. Therefore, preferentially a code word size n greater than (2k)−1 is used.

Furthermore, it is seen that there are some preferential n values (e.g. around 300 and around 340) for which the average rate is larger than that for higher and smaller n values. Such n-values provide for additional efficiency. Preferably, the memory is simulated first for different n-values and a preferential n-value is selected for use in the circuit.

Returning now to the operation of the circuit of FIG. 1, during writing processor 10 supplies an address to memory 120, which in turn retrieves a WOM code word from an addressed location and outputs the WOM code word to decoder 121 and feasible update detection circuit 123. Decoder 121 decodes a data word from the code word and supplies this data word (which will be called the previous data word, Y0) to subtractor 122. Processor 10 supplies a new data word Y1 to subtractor 122, which outputs a signal representing the k-bit difference D=Y1−Y0 between the k-bit new data word Y1 and the k-bit previous data word Y0. This difference D is supplied to single bit adequate update detection circuit 124. If the difference D is zero, single bit adequate update detection circuit 124 signals to update circuit 125 that no update is necessary, upon which the write operation to WOM memory unit 12 is completed.

Feasible update detection circuit 123 detects which single bit updates to the code word in memory 120 are feasible. For each of a set of possible changes in the decoded data word, feasible update detection circuit 123 produces a signal indicating whether there is a feasible single bit update that results in this change. Memory 120 is for example a PROM memory or a flash EEPROM, in which it is much more difficult (if at all possible) to reset bits than to set bits. Updates that can be realized by setting a bit are called feasible.

When the difference D is not zero, single bit adequate update detection circuit 124 detects whether the difference D corresponds to an update for which feasible update detection circuit 123 indicates that a single bit update is feasible. If so, single bit adequate update detection circuit 124 signals the update to update circuit 125, which, in response, sets a bit in memory 120 that results in an update corresponding to D.

When the difference D is not zero and no single bit adequate update is feasible, WOM memory unit 12 attempts to determine a feasible two-bit update to memory 120 that results in the required change D. For this purpose, the outputs of the feasible update detection circuit 123 are fed to the coincidence detector 127 twice, via cross-connection circuit 126. Cross-connection circuit 126 permutes the connections that it makes between the outputs of feasible update detection circuit 123 and coincidence detector 127 under control of difference D. Coincidence detector 127 detects coincidence between signals for a number of pairs of signals. Coincidence detector 127 contains for example a set of pair detectors like AND gates, each for detecting coincidence between the signals of a respective pair. Each pair contains a signals received feasible update detection circuit 123 via cross-connection circuit 126. Cross connection circuit 126 is arranged so that, when a pair that contains a signal about the feasibility of an update U directly from feasible update detection circuit 123, cross-connection circuit 126 supplies the pair detector with the signal about the feasibility of update V, which combines with update U to provide the required difference D.

Generally speaking the identity of update V is a function f(U,D,X) of the identity of the update U (k-bits) with which it is combined, the required difference D (k-bits) and the code word X (n-bits) that is currently stored in memory 120.

However, it has been found that for many WOM coding schemes, such as for example in case of a linear WOM code, the identity of the update V does not depend on the currently stored codeword, other than through the difference D:V=f(U,D). This is exploited in the cross-connection circuit 126 to direct the signal about the update V to the detector for the pair that receives the signal about the update U from feasible update detection circuit 123. This redirection can be accomplished under control of D.

When coincidence detector 127 detects that both signals in a pair indicate feasible updates, this means that the two-bit update of the WOM code word corresponding to the pair is feasible and adequate to produce the required new dataword. Of course, it is possible that coincidence detector detects this feasibility combined with adequacy for more pairs. Arbiter 128 selects one the pairs that is feasible and adequate and outputs signals identifying the updates from the pair to update circuit 125. In response, update circuit 125 sets two bits in memory 120 that results in an update corresponding to the updates indicated by the arbiter 128.

In principle arbiter 128 may make a random selection, or for example a pair with a lowest order bit. However in a preferred embodiment pairs are given ranks of preference and an adequate and feasible pair with highest rank of preference is selected. In this case highest preference is given to pairs in which both bits correspond to mask vector values that correspond to more than one bits which are not set in the code word, the preference among these pairs preferably being higher when there are more such bits. Next lower preference is given to pairs in which one of the bits corresponds to a mask vector value that corresponds to another more than bit which is not set in the code word, with again preferably higher preference among these pairs when there are more such bits.

In case memory 120 is a flash memory, or an EEPROM and arbiter 128 signals that no update is possible, update circuit erases the addressed memory location in memory 120. After erasing, a single bit is set in the location in order to realize the required data word (if the data word is zero, no bit needs to be set). That is, no search is conducted for updates that require setting of three bits or more. Although this means that some of the capacity of memory 120 is lost, it has been found that this loss is small, typically only 1.15% for k=8 and n=1020 for a linear WOM code and random input.

Figure 4:
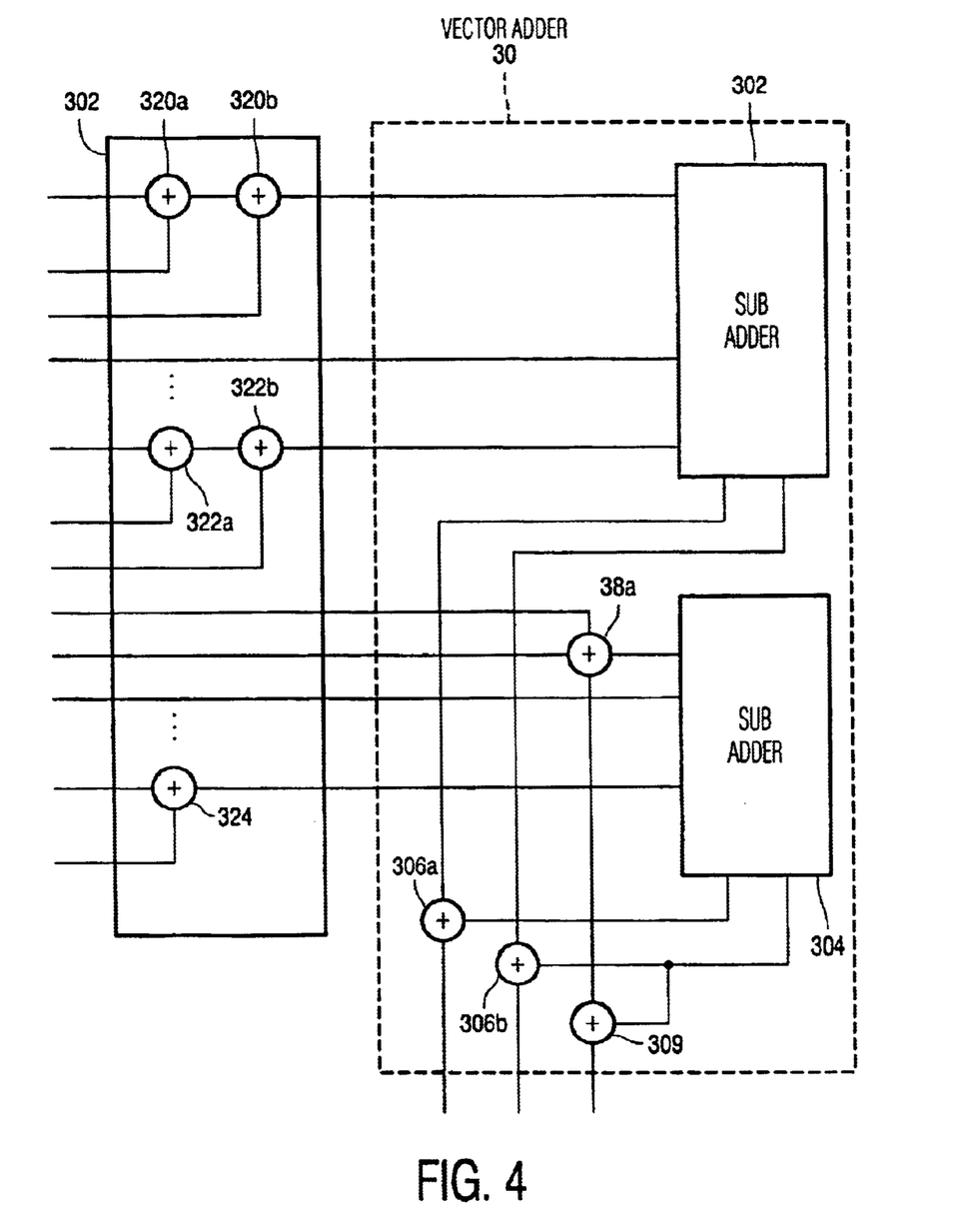
FIG. 4 shows a decoder circuit

FIG. 4 shows a decoder circuit for a linear WOM code that uses the bit-wise exclusive or as addition. The decoder circuit contains a vector adder 30 and a collector circuit 32. The vector adder 30 serves to add information about bits at bit positions in the code word that correspond to the same mask vector value. The added information for the various mask vector values is fed to the vector adder 30. Each output of the collector circuit 32 corresponds to a different mask vector. The vector adder 30 adds those vectors for which the outputs of collector circuit 32 indicate a logic 1.

In principle, there are $(2^{}k)-1$ different mask vectors (k being the number of bits in a data word), each corresponding to a different non-zero mask vector value. From top to bottom, the outputs correspond to mask vector with increasing value (00 . . . 01, 00 . . . 10, 00 . . . 11, etc). Thus, of the $(2^{}k)-1$ mask vectors, the mask vectors that correspond to the lower half $(2^{}(k-1))$ vectors) of the outputs of collector circuit 32 have a most significant bit equal to one, the top half $((2^{}(k-1))-1)$ have a most significant bit equal to zero. (For simplicity of discussion, the word "half" will be used as if there were $2^{**}k$ mask vectors, including a fictitious all-zero mask vector, corresponding to a fictitious topmost output of collector circuit 32). The vector adder 30 has two parts: a first part of the vector adder 30 adds the outputs of the collector circuit 32 for mask vectors where these most significant bits are one, a second part, comprising sub adders 302, 304 adds the less significant bits of the mask vectors.

The collector circuit 32 contains branches of cascaded exclusive or gates 320a–b, 322a–b, 324. Each branch corresponds to a different mask vector value and the branch determines the exclusive—or of the bits in the addressed code word that correspond to the mask vector value. In sum, the collector circuit has n inputs (n being the codeword size).

In case only one bit corresponds to a certain mask vector value the branch may be omitted and the bit can be fed directly to the vector adder. If no mask vector value corresponds to more than one bit the entire collector circuit 32 may be omitted. In total, the collector circuit has a maximum of (2**k)−1 outputs.

The vector adder 30 serves to add the vector values of those vectors for which the collector circuit 32 indicates a logic one. Typically, the vector adder has M=(2**k)−1 inputs for indicating the binary weight assigned to the various mask vectors and k outputs for the various components of the summed vectors. By way of example, the vector adder 30 is shown composed of two identical sub-adders 302, 304 and a number of exclusive or gates 306a,b, 309.

The sub-adders 302, 304 compute all but the most significant bit of the sum of the mask vectors M' weight bits (M' being half of the number of incoming weight bits M (M'= (M−1)/2)). Corresponding outputs of the sub-adders 302, 304 (for the same significance level in the mask vectors) are logically added with exclusive or gates 306a–b, to form the least significant bit outputs of the adder 30. To form the most significant bit output one of the inputs of the vector adder 30 is not connected to the sub-adders 302, 304 but to a cascade 38a of exclusive or gates (only one 38a shown). The exclusive or gate adds the signals from approximately half ((M−3)/4) of the (M−1)/2 inputs of the second sub-adder 304 to the signal from this one of the inputs. The output of the cascade 38a is fed to a further exclusive or gate 309, which also receives the most significant bit of the output of the second sub-adder 304. Further exclusive-or gate 309 outputs the most significant bits of the summed mask vectors. Exclusive-or gate 309 serves to add the outputs of the collector circuit 32 that correspond to mask vectors for the lower half of the outputs of collector circuit 32. This could be realized by extending the cascade 38a to each output in the lower half of the outputs of the collector circuit 32. But this is not necessary, because the lower half of this lower half of the outputs is added anyway in the sub-adder 304. The circuit of FIG. 4 uses the sum from sub-adder 304.

FIG. 4 is the basis for a recursive definition of the vector adder 30. Each sub-adder 302, 304 in turn has the same structure as the vector adder 30, but scaled down to one output less than the adder 30 and to a number of inputs that is half of the number of inputs of the adder 30 minus one. By repeatedly decomposing the sub-adders in the same way, the vector adder 30 can be decomposed until one arrives at a one input-one output sub adder. The one input-one output vector adder is simply a direct connection between its input and its output.

Similar adder circuits may be designed for WOM codes that use other types of addition, such as modulo 2**n addition. Preferably, these are also constructed recursively, with a section for adding the most significant bits of the mask vectors and sub-sections for adding the remaining bits. Other types of adders are also possible, for example by treating the bits in the WOM codeword as coefficients in a polynomial p(x) and by determining the remainder after division by a generator polynomial g(x), using any technique known for error correcting codes. Thus the weight assigned to each WOM bit corresponds to the remainder obtained when dividing a power of x the generator polynomial g(x).

Figure 5:
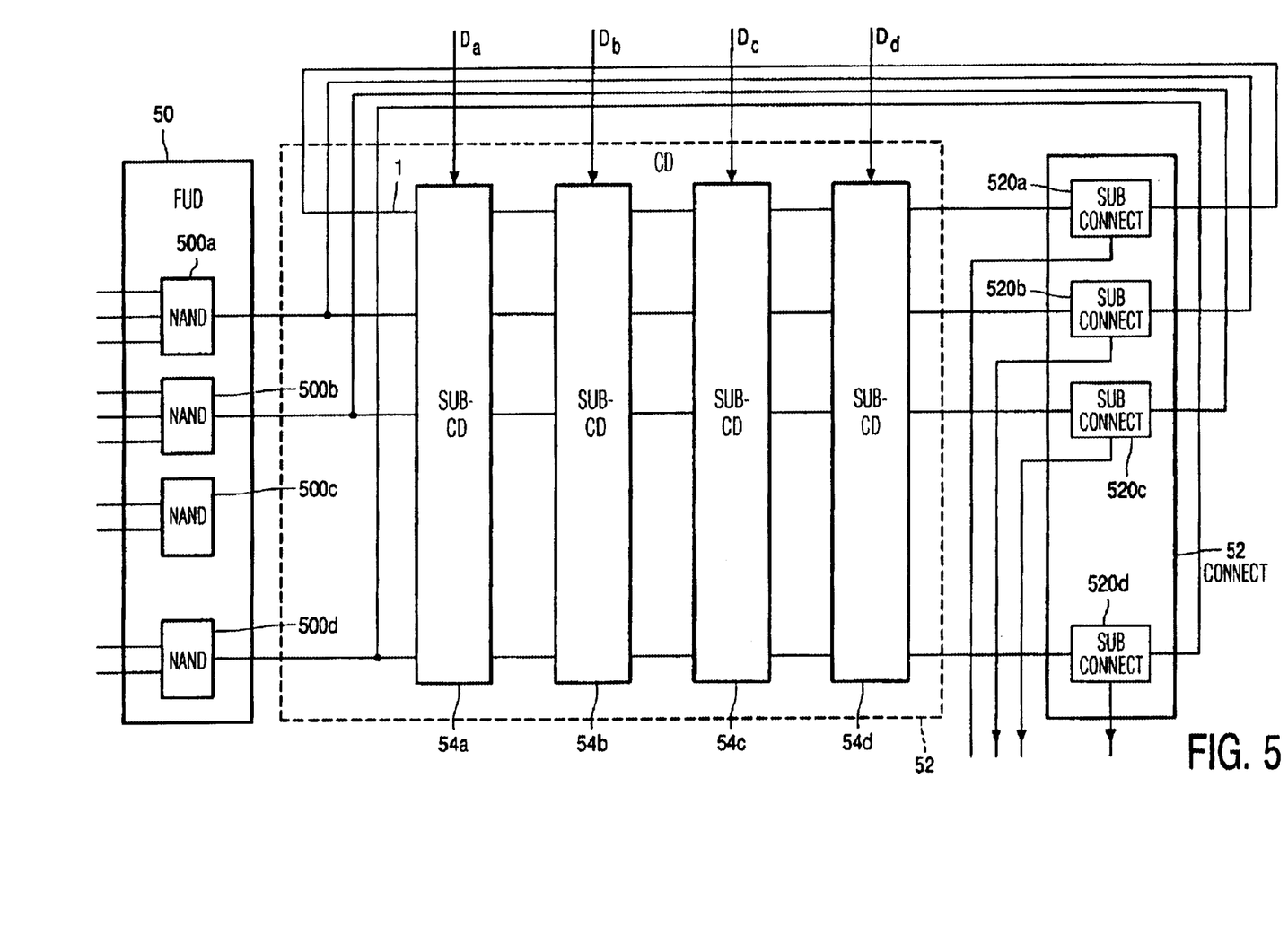
FIG. 5 shows a two-bit update detection circuit

FIG. 5 shows a two bit update detection circuit containing a feasible update detection circuit 50, a connection circuit 52 and a coincidence detector 54. The function of the two-bit update detection circuit is to determine which combinations of two bits in the code word can be set to effect a change D in the decoded data word. Basically speaking, all connections between the feasible update detection circuit 50, the connection circuit 52 and the coincidence detector 54 carry so-called feasibility signals. Each feasibility signal corresponds to a specific mask vector (as will be appreciated a mask vector equals an update that can be realized by setting a single bit in the codeword). The feasibility signal for the specific mask vector is active when there is any bit in the code word that corresponds to the specific mask vector and that has not yet been set.

Generally speaking, the signal lines in the figure for the feasibility signals for different mask vectors are arranged from top to bottom in order of increasing weight (strarting with mask vector (00 . . . 01), and ending with mask vector (11 . . . 11)).

The function of the feasible update detection circuit 50 is to generate feasibility signals for various mask vectors. A feasibility signal is made active when feasible update detection circuit 50 detects that there is any bit in the code word that has not yet been set and that corresponds to a specific mask vector. By way of example, the feasible update detection circuit 50 contains a number of NAND gates 500a–d. Each NAND gate 500a–d receives the bits stored in the WOM code word that correspond to a respective mask vector. Thus, the output of each NAND gate 500a–d produces the feasibility signal that indicates whether there is any bit in the code word that has not yet been set and corresponds to a specific mask vector.

The function of the coincidence detector 54 is to detect simultaneous activity of signals in pairs of feasibility signals. The feasibility signals in a pair indicate the feasibility of respective updates that together lead to the required change in the decoded dataword. The coincidence detector 54 contains a number of sub-detectors 540a–d (each for example an AND gate). The outputs of the NAND gates 500a–d are coupled directly to a first input of respective ones of the sub-detectors 540a–d. The outputs of the NAND gates 500a–d are also coupled to a second input of the respective ones of the sub-detectors, via connection circuit 52.

The function of connection circuit 52 is to bring together pairs of feasibility signals for updates that together lead to the required change in the decoded dataword. Connection circuit 52 operates under control of respective bits of a difference signal D that represents the required change. For reasons of systematic presentation, connection circuit 52 is shown to have one dummy input and output (corresponding to a no-change update), which is not connected to any one of the NAND gates 500a–d and coincidence sub-detectors 540a–d. Obviously, circuitry that involves only this dummy input/output may be omitted in practical circuits.

Connection circuit 52 is shown as a series of layers of sub-connection circuits 56a–d, connected in cascade. The connections between each pair of layers 56a–d contains a set of conductors for carrying the feasibility signals for all possible updates. Similarly, the first an final layer 56a,d have such connections to the feasible update detection circuit and the coincidence detector respectively. Each layer receives a respective one of the bits of the difference signal D as a control signal.

In operation, each layer 56a–d reroutes the feasibility signals from the feasible update detection circuit 50 under control of a respective one of the bits of the difference signal D. This is done so that, if a coincidence sub-detector 540a–d receives a feasibility signal about an update U directly from the feasible update detection circuit 50, then the connection circuit 52 supplies that coincidence sub-detector 540a–d with a feasibility signal about an update V that, combined with U, leads to a change in data word equal to D.

The connection circuit 52 performs this rerouting task in successive layers for successive bits of the difference signal D. Basically, each layer performs this same task under control of a different relevant bit of D. Each layer reroutes the feasibility signals as required by the value Di of a bit at position i of D, assuming some given value (e.g. zero) for the remainder D' of D. That is, if a coincidence sub-detector 540a–d receives a feasibility signal about an update U directly from the feasible update detection circuit 50, then, at an output that corresponds with that coincidence sub-detector 540a–d, the a layer 56a–d supplies a feasibility signal about an update V that, combined with U, leads to a change in data word equal to Di with the given value (e.g. zero) for the remainder D'.

When the bit Di of the difference signal is zero, the layer 56a–d produces a certain routing, feeding the feasibility signal for each specific update V to a first specific input I(V) of the coincidence detector 54 for the given remainder D'. When the bit is Di of the difference signal D is one, the feasibility signal for each specific update V is rerouted to a second specific input I'(V) of the coincidence detector 54. The second specific input I'(V) used for an update V corresponds to the first specific input I(V') for the update V'that results when one adds the bit Di to the original update V.

In case of a linear WOM code the layers 56a–d can be connected in any sequence. Also it is not necessary to connect the coincidence detector 54 at the end of the connection circuit 52. The coincidence detector 54 can be placed between any pair of layers 56a–d. A circuit that is modified in this respect can be obtained from FIG. 5 by providing a short circuit each pair of inputs to each coincidence sub-detector 540a–d and removing the coincidence sub-detectors 54a–h from their original location. The inputs of each respective coincidence sub-detectors 540a–d should each instead be connected to a respective one of the connecting conductors between any pair of layers, interrupting the conductors between the inputs of the coincidence sub-detectors 540a–d. The inputs of the coincidence different sub-detectors 540a–d could even be connected to conductors between mutually different layers 56a–d, as long as no pair of sub-detectors 540a–d is connected to conductors that can simultaneously carry the feasibility signal for the same update between different layers.

The exact implementation of the cross-connection circuit 52 depends on the type of WOM coding.

Figure 6:
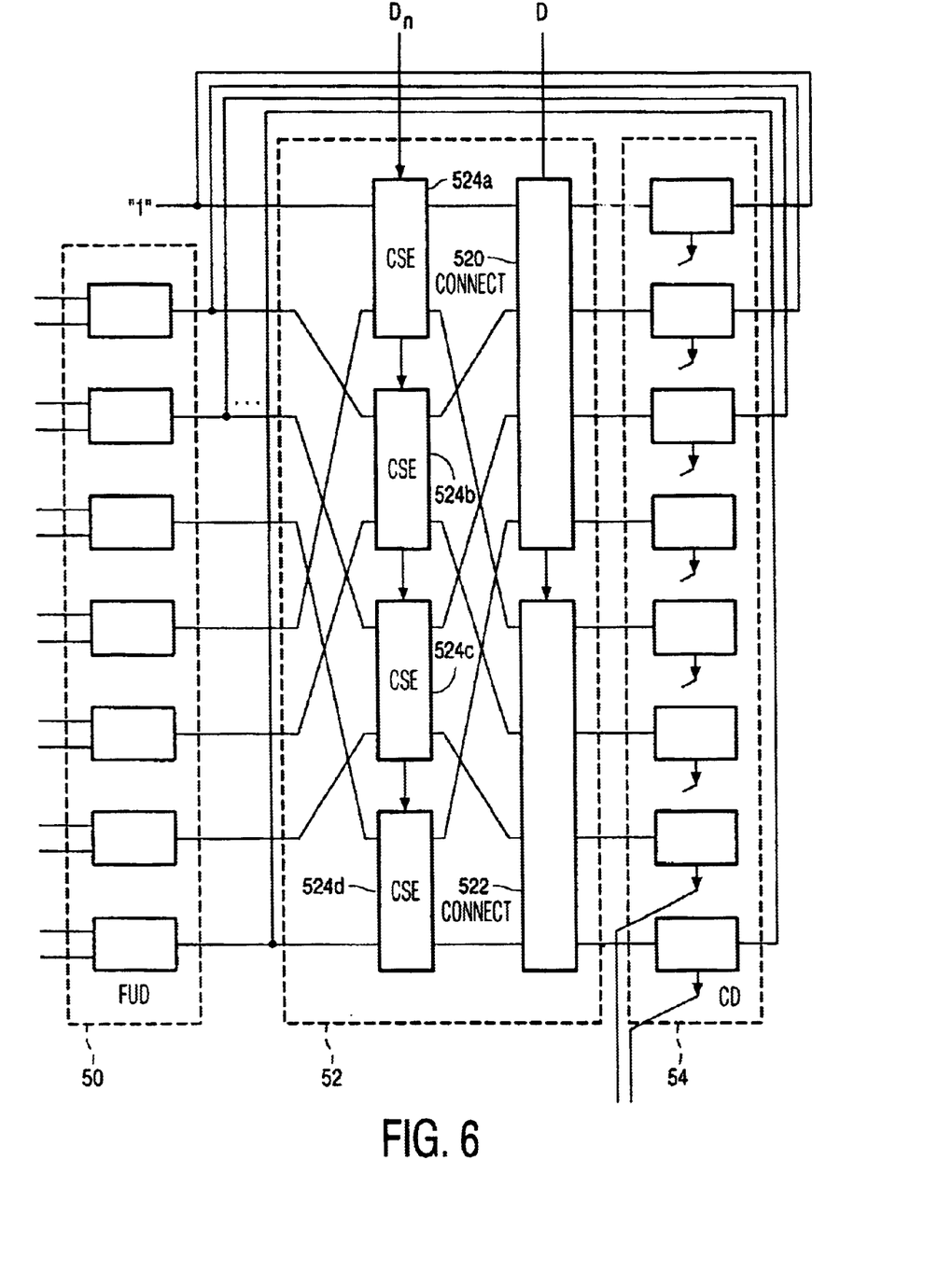
FIG. 6 shows a further two-bit update detection circuit

FIG. 6 shows an example of a connection circuit for linear WOM coding in which the bit-wise exclusive-or is used as addition. FIG. 6 contains the same components as FIG. 4, but the layers have been worked out in greater detail and they have been incorporated in recursively defined lower order connection circuits 520, 522.

The connection circuit 52 for cross-connecting 2m (e.g. m=3) signals contains a first and second lower order connection circuit 520, 522 each for 2(m–1) signals, and a number of 2**(m–1) controllable signal exchange units 524a–d. The controllable signal exchange units 524a–d form a first one of the layers for rerouting the feasibility signals. The controllable signal exchange units 524a–d have control inputs coupled to receive the most significant bit of the difference signal D.

A least weight half of the outputs of the NAND gates in feasible update detector 50 are connected to a first input of respective ones of the controllable signal exchange units 524a–d. The highest weight half of the outputs of the feasible update detector 50 are connected to a second input of respective ones of the controllable signal exchange units 524a–d. Conversely, first outputs of the controllable signal exchange units 524a–d are connected to the inputs of the first lower order connection circuit 520. Second outputs of the controllable signal exchange units 524a–d are connected to the inputs of the second lower order connection circuit 522. The outputs of the first lower order connection circuit 520 are connected to respective outputs of a lower weight half of the outputs of the connection circuit 52. The outputs of second lower order connection circuit 522 are connected to a higher weight half of the outputs of the connection circuit 52.

The structure of the lower order connection circuits 520, 522 is defined recursively. These lower order connection circuits 520, 522 have a similar structure as the connection circuit 52, except that the number of their inputs (2(m–1)), controllable signal exchange units and outputs is half that of the connection circuit 52. The structure of successively lower order connection circuits is obtained similarly by halving, until one arrives at a one input-one output connection circuit, which is simply a one to one input/output connection. For clarity, only one such recursive level is shown in FIG. 5. Basically speaking, there are layers of 2(m–1) controllable signal exchange units for every bit of the difference signal, of which the controllable signal exchange units 524a–d is but the first layer, which provides the most distant cross-connections. The controllable signal exchange units in the successively lower order connection circuits are controlled by successively lower significant bits of the difference signal D.

It will be understood that the structuring of the cross-connection circuit 52 in recursively defined lower order cross-connection circuits 520, 522 is merely for the purpose of definition and explanation.

In operation, the first layer of signal exchange units 524a–d reroutes the feasibility signals as required by the value of the most significant bit Dn of D, assuming some given value (e.g. zero) for the remainder D' of D. That is, if a coincidence sub-detector 540a–d receives a feasibility signal about an update U directly from the feasible update detection circuit 50, then, at an output that corresponds with that coincidence sub-detector 540a–d, the signal exchange units 524a–h supply a feasibility signal about an update V that, combined with U, leads to a change in data word equal to Dn with the given value (e.g. zero) for the remainder.

When the most significant bit Dn of the difference signal is zero, the signal exchange units 524a–d produce a certain routing, feeding the feasibility signal for each specific update V to a first specific input I(V) of the coincidence detector 54 for the given remainder D'. When the most significant bit Dn of the difference signal D is one, the feasibility signal for each specific update V is rerouted to a second specific input I'(V) of the coincidence detector 54. The second specific input I'(V) used for an update V corresponds to the first specific input I(V') for the update V' which differs original update V at the most significant bit position only. That is, the controllable signal exchange units 524a–d mutually exchange the feasibility signals that are fed to inputs of the coincidence detector 54 which correspond to the same update except for the most significant bit.

The lower order connection circuits 520, 522 reroute these feasibility signals under control of the remaining, less significant bits of the difference signal D, so as to bring together feasibility signals for two update U,V at each coincidence sub-detector in coincidence detector 54, where the updates U,V together produce the required change D in the data word. Each layer of signal exchange units performs rerouting under control of a different bit Di of the difference D. Each layer operates basically in the same way as the first layer of signal exchange units 524a–d, except that it exchanges feasibility signals for updates that differ only at a bit position corresponding to the bit Di of the difference signal D that control this layer of signal exchange units 524a–d.

Throughout this explanation it has been assumed that the controllable signal exchange units merely provide exchangeable electric connections, but of course one may also use logic gates directed towards the coincidence detector 54 to implement the rerouting function in a one directional manner. For example one could use a set of multiplexers in each layer, which route either a first or a second feasibility signal to the next layer, under control of a bit Di of the difference signal.

Various alternative structures for the layers are possible, depending on the type of addition used to decode the WOM codeword. In each case, the layers reroute each feasibility signal so as to arrive at the coincidence detector 54 in combination with another feasibility signal that together with the feasibility signal would lead to the specified difference signal D. For a control bit Di that has the value 0 the feasibility signal runs straight on in case of a linear code, but for a control bit Di that has the value 1, the control bit is permuted as required by the type of addition.

Figure 7:
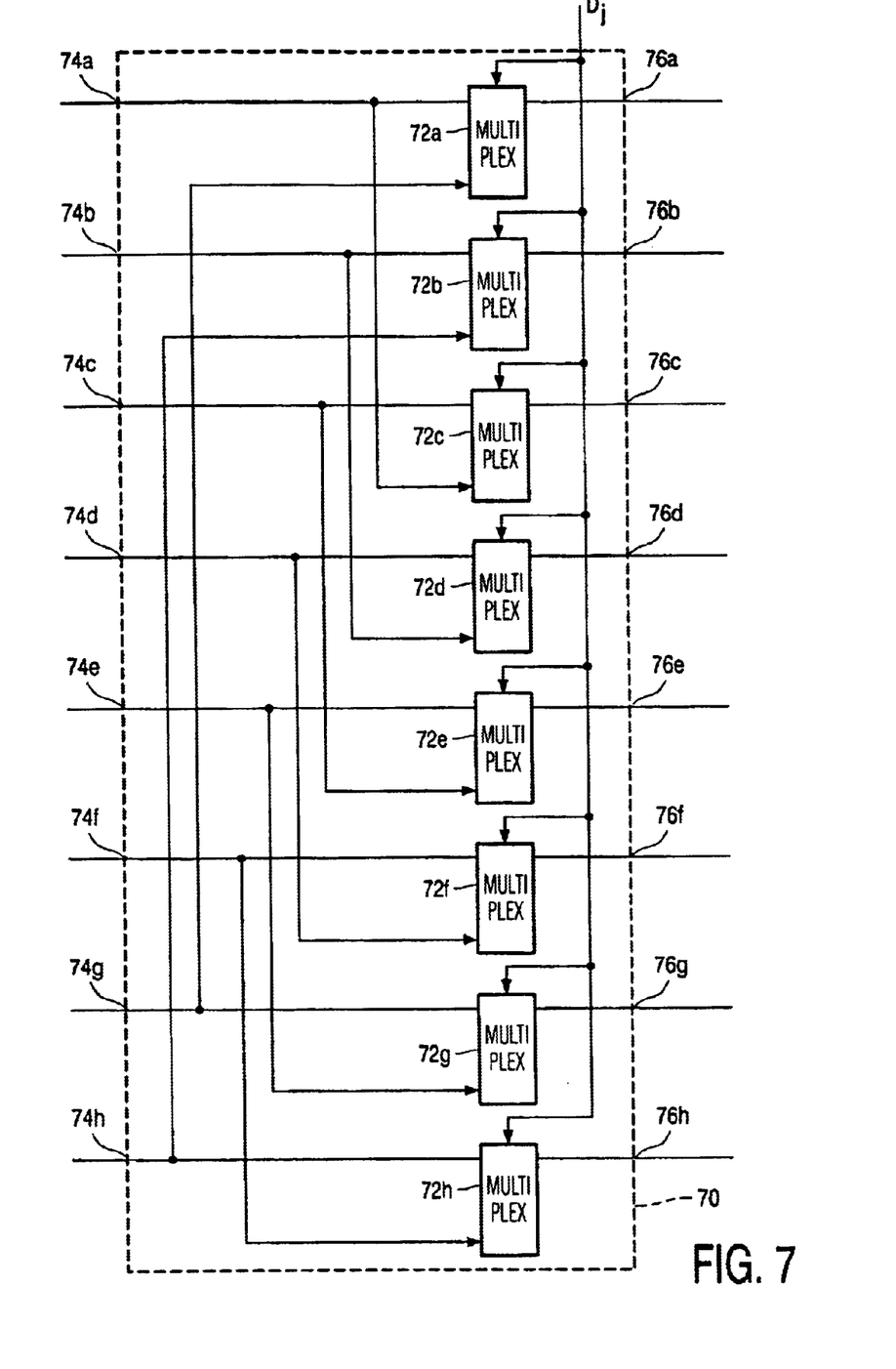
FIG. 7 shows a layer of a cross-connection circuit.

FIG. 7 shows an example of a layer 70 for rerouting feasibility signals for use with a linear WOM code that uses modulo $2^{}n$ addition as addition operation. By way of example the layer for the second bit Dj (j=2) of the difference signal D in order from lowest significance is shown for an n=3 bit codeword. The layer 70 contains a number of $2^{}n=8$ multiplexers 72a–h, which are connected to input conductors 74a–h and output conductors 76a–h for $2^{}n$ feasibility signals. The ith input conductor 74a–h is coupled to the ith output conductor 76a–h via a first input of the ith multiplexer 72a–h. The ith input conductor 74a–h is coupled to the $((i+2) \bmod 2^{}n)$th output conductor via the $((i+2) \bmod 2^{**}n)$th multiplexer 72a–h. The multiplexers 72a–h are controlled by the second bit Dj (j=2) of the difference signal j. Other connections between the multiplexers would occur when other types of decoding are used.

What is claimed is:

1. A data processing device comprising
   a memory location for storing a codeword for encoding successive data values according to a WOM code;
   a feasibility detector arranged to generate feasibility signals, each for a respective update to a data word encoded in the memory location, each feasibility signal indicating whether, given the current value in the memory location, the update is feasible;
   an input for receiving a new data value;
   a two-bit update detection circuit arranged to bring together pairs of selected ones of the feasibility signals, each pair for a respective first and second one of the updates to the memory location, selection of the feasibility signals in the pair being controlled dependent on the new generation so as to bring together feasibility signals selected so that the first and second update of the pair executed together update a current value of the codeword in the memory location to a next value encoding the new data value, the two bit update detection circuit detecting whether both the first and second feasibility signal of the pair indicate feasibility;
   a selection circuit for selecting one of the pairs of signals, for which both the first and second signal indicate feasibility with the current value;
   an update circuit triggered by the selection circuit to execute the first and second update in the memory location according to the selected pair.

2. A device according to claim 1, wherein the detection circuit comprises
   a cross-connection circuit operable under control of a multi-bit change signal that represents a difference between the new data value and the data encoded by the current value of the codeword;
   a set of coincidence detection circuits, each with first and second inputs for receiving feasibility signals from a respective one of the pairs, the first and second input being coupled to the feasibility detector via a first and second path respectively,
   the cross-connection circuit comprising a cascade of a plurality of layers interconnected by conductors for carrying the feasibility signal, each layer containing one of the paths for each pair, each layer performing part of the rerouting under control of a respective one of the bits of the change signal.

3. A device according to claim 1, wherein the memory location contains a plurality of bits, each associated with a mask vector, at least two of the bits being associated with a same mask vector; the feasibility detector containing a collecting circuit, for generating the signal that corresponds to the update by said same mask by collecting information stored in the memory location for the at least two of the bits, the signal information indicating whether at least one of the at least two bits is not set in the current value of the codeword.

4. A device according to claim 3, the device containing
   a WOM code decoder arranged to decode data from the memory location by summing the mask vectors associated with bits that are set in the memory location.

5. A device according to claim 1, arranged to reset a plurality of bits of the memory location collectively when a single bit update encoding the new data is feasible and the two-bit update detection circuit signals that it does not find a feasible two-bit update that encodes the new data value.

* * * * *